(12) United States Patent
Li et al.

(10) Patent No.: US 12,563,971 B2
(45) Date of Patent: Feb. 24, 2026

(54) TWO-DIMENSIONAL SEMICONDUCTOR STRUCTURE WITH CONTROLLABLE MAGNETIC STATE AND FERROMAGNETIC RESONANCE

(71) Applicants: BROWN UNIVERSITY, Providence, RI (US); NATIONAL TECHNOLOGY & ENGINEERING SOLUTIONS OF SANDIA, LLC, Albuquerque, NM (US)

(72) Inventors: Jia Li, Providence, RI (US); Andrew Mounce, Albuquerque, NM (US); Erin Morissette, Providence, RI (US); Jiangxiazi Lin, Providence, RI (US)

(73) Assignees: BROWN UNIVERSITY, Providence, RI (US); NATIONAL TECHNOLOGY & ENGINEERING SOLUTIONS OF SANDIA, LLC, Albuquergue, NM (US)

( * ) Notice: Subject to any disclaimer, the term of this patent is extended or adjusted under 35 U.S.C. 154(b) by 507 days.

(21) Appl. No.: 18/103,290

(22) Filed: Jan. 30, 2023

(65) Prior Publication Data

US 2023/0247911 A1 Aug. 3, 2023

Related U.S. Application Data

(60) Provisional application No. 63/319,792, filed on Mar. 15, 2022, provisional application No. 63/304,891, filed on Jan. 31, 2022.

(51) Int. Cl.
*H10N 50/01* (2023.01)
*H01P 3/16* (2006.01)
*H01P 11/00* (2006.01)
*H10B 61/00* (2023.01)
*H10N 50/85* (2023.01)

(52) U.S. Cl.
CPC .............. *H10N 50/01* (2023.02); *H01P 3/16* (2013.01); *H01P 11/006* (2013.01); *H10B 61/10* (2023.02); *H10N 50/85* (2023.02)

(58) Field of Classification Search
CPC ........ H10N 50/01; H10N 50/85; H10N 50/00; H01P 3/16; H01P 11/006; H10B 61/10; H01F 10/005
USPC .................................................. 365/158, 173
See application file for complete search history.

(56) References Cited

U.S. PATENT DOCUMENTS

2014/0008616 A1* 1/2014 Geim ................... H10D 64/251
257/24
2020/0027504 A1* 1/2020 Sharma .................. H10B 63/30

* cited by examiner

*Primary Examiner* — Michael T Tran
(74) *Attorney, Agent, or Firm* — Tarolli, Sundheim, Covell & Tummino LLP

(57) ABSTRACT

Systems and methods are provided for fabricating an assembly with a controllable magnetic state and ferromagnetic resonance. A layer of twisted bilayer graphene is positioned in contact with a transition metal dichalcogenide to form a structure with an interface between the twisted bilayer graphene and the transition metal dichalcogenide. Energy is applied to the interface to adjust one of a magnetic state associated with the interface and a ferromagnetic resonance associated with the interface.

20 Claims, 2 Drawing Sheets

TWO-DIMENSIONAL SEMICONDUCTOR STRUCTURE WITH CONTROLLABLE MAGNETIC STATE AND FERROMAGNETIC RESONANCE

RELATED APPLICATIONS

This application claims priority from each of U.S. Provisional Patent Application Ser. No. 63/304,891 filed on Jan. 31, 2022, and entitled "2D MATERIAL BASED PARAMETRIC OSCILLATOR AND MAGNETIC MEMORY BASED ON 2D MATERIAL," and U.S. Provisional Patent Application Ser. No. 63/319,792 filed on Mar. 15, 2022, and entitled "2D MATERIAL BASED PARAMETRIC OSCILLATOR AND MAGNETIC MEMORY BASED ON 2D MATERIAL." Each of these applications are hereby incorporated by reference in its entirety.

GOVERNMENT FUNDING STATEMENT

This invention was made with Government support under Contract No. DE-NA0003525 awarded by the United States Department of Energy/National Nuclear Security Administration. The U.S. Government has certain rights in the invention.

TECHNICAL FIELD

The present invention relates to two-dimensional semiconductors, and more particularly, to a two-dimensional semiconductor structure with a controllable magnetic state and ferromagnetic resonance.

BACKGROUND

In materials science, the terms single-layer materials and two-dimensional materials refer to crystalline solids consisting of a single layer of atoms. Single layers of two-dimensional materials can be combined into layered assemblies. For example, bilayer graphene is a material consisting of two layers of graphene and trilayer graphene is a material formed from three layers of graphene. A two-dimensional semiconductor is a type of natural semiconductor with thicknesses on the atomic scale. Two-dimensional semiconductor materials are often synthesized using a chemical vapor deposition method. They can also be exfoliated from bulk crystals with layered structure. These individual layers are then assembled together to form two-dimensional heterojunctions, which are interfaces between two layers or regions of dissimilar materials.

SUMMARY OF THE INVENTION

In one aspect of the present invention, a method is provided for fabricating an assembly. A layer of twisted bilayer graphene is positioned in contact with a transition metal dichalcogenide to form a structure with an interface between the twisted bilayer graphene and the transition metal dichalcogenide. Energy is applied to the interface to adjust one of a magnetic state associated with the interface and a ferromagnetic resonance associated with the interface In another aspect of the present invention, a system includes a transmission line configured to carry a microwave signal and a structure comprising a layer of a magic-angle twisted bilayer graphene positioned in contact with a transition metal dichalcogenide to form an interface between the magic-angle twisted bilayer graphene and the transition metal dichalcogenide. The structure is positioned proximally to the transmission line such that transmission of the microwave signal through the transmission line generates a transport response at the structure.

In a further aspect of the present invention, a system includes a structure comprising a layer of a twisted bilayer graphene positioned in contact with a transition metal dichalcogenide to form an interface between the twisted bilayer graphene and the transition metal dichalcogenide. A control apparatus associated with the structure is configured to apply energy to the structure to control a magnetic state associated with the interface.

DETAILED DESCRIPTION

As used herein, twisted multi-layer graphene refers to a material formed from multiple layers of graphene in which at least one layer has been rotated, or twisted, at a predetermined angle relative to at least one other layer. In one example, the predetermined angle is 1.05 degrees.

As used herein, a field is out-of-plane for a given plane when the dot product of a vector representing a direction of the field at the plane and a vector normal to the plane is non-zero.

As used herein, a structure is positioned proximately to transmission line when either or both of a magnetic field and an electric field produced via passage of a signal through the transmission line has sufficient strength to induce a transport response in the structure.

As used herein, a transition metal dichalcogenide is a compound of the type $MX_2$, where M is a transition metal and X a chalcogen (e.g., S, Se, or Te). As used herein, a monolayer of a transition metal dichalcogenide is one-atom thick layer of transitional metal positioned between two one-atom thick layers of the chalcogen.

As used herein, a microwave signal is a signal having a frequency between one gigahertz and thirty gigahertz.

Figure 1:
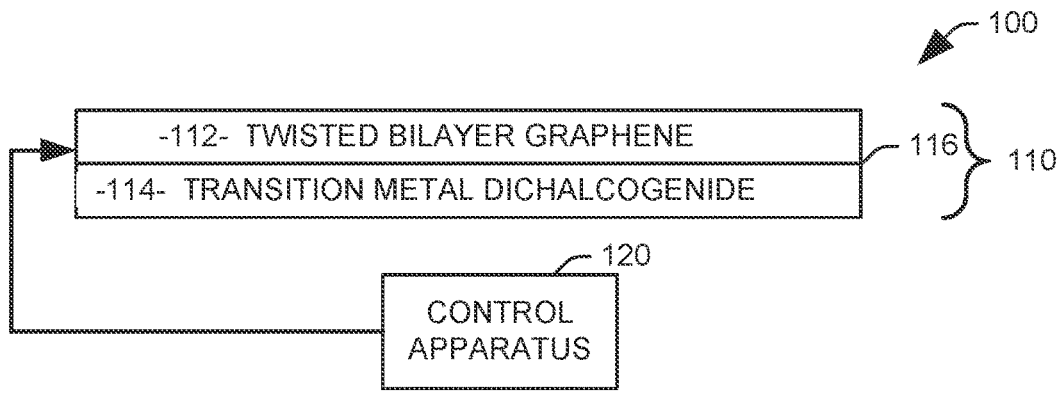
FIG. 1 illustrates an assembly comprising a structure having a magnetic state and ferromagnetic resonance that is controllable to provide a desired function.

FIG. 1 illustrates an assembly 100 comprising a structure 110 having a magnetic state and ferromagnetic resonance that is controllable to provide a desired function. The assembly 100 includes a structure 110 with a layer of twisted bilayer graphene 112 in contact with a layer of transition metal dichalcogenide 114 to form an interface with a valley ferromagnetic state being stabilized at the interface 116. In one implementation, the twisted bilayer graphene is magic-angle twisted bilayer graphene, in which the angle of the twist between the two layers is equal to one of the magic angles for twisted bilayer graphene. In one example, the twist angle is between 1 and 1.1 degrees. The transition metal dichalcogenide can be tungsten diselenide.

A control apparatus 120 associated with the structure 110 is configured to control a magnetic state or ferromagnetic resonance associated with the interface 116 and provide a desired function. The control apparatus 120 can include, for example, any of a current source configured to provide a DC current, a voltage source, a gate electrode connected to a voltage source and configured to apply field effect gating to the interface 116, an electric field source configured to apply an out-of-plane electric field to the interface 116, and a magnetic field source configured to apply an out-of-plane magnetic field to the interface 116. It will be appreciated that the control apparatus 120 can include more than one of these structures to provide multiple avenues for controlling the state or resonance and controlling the function of the structure 110.

In one example, the magnetic state is controllable via the control apparatus 120 to store a bit within the structure or read a bit from the structure, allowing the device to serve as a memory. In another example, the structure 110 can be configured to serve as a parametric oscillator, which can be used either as a parametric signal amplifier or as a rectifier for a microwave signal.

Figure 2:
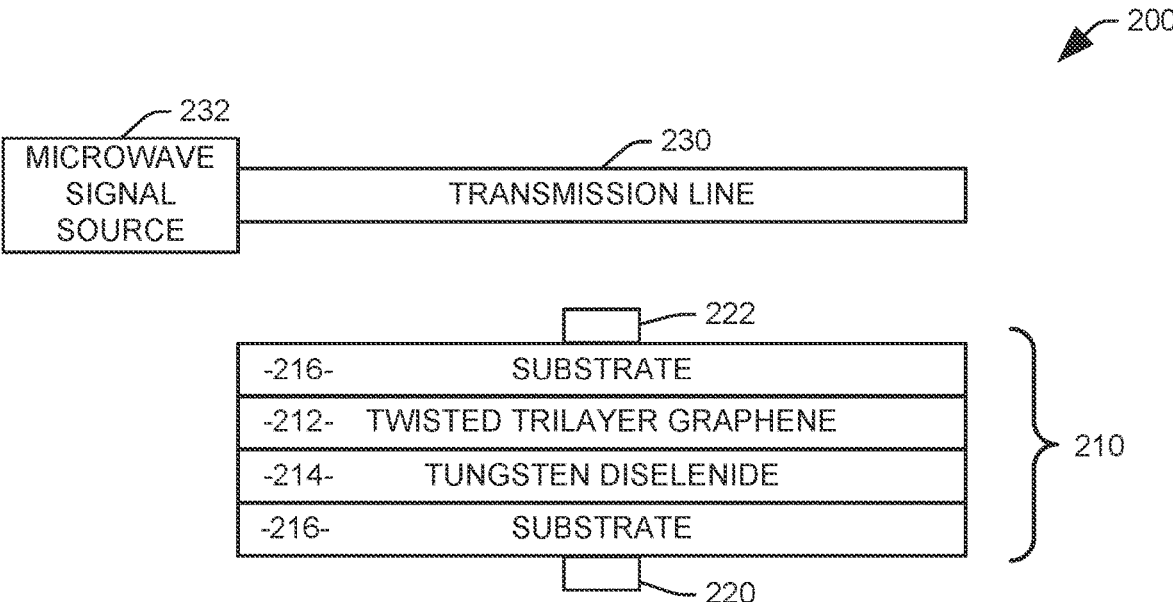
FIG. 2 illustrates an example implementation of the system of FIG. 1 utilizing a structure formed from magic-angle twisted bilayer graphene and a layer of tungsten diselenide.

FIG. 2 illustrates an example implementation 200 of the system of FIG. 1 utilizing a structure 210 formed from magic-angle twisted bilayer graphene 212 and a layer of tungsten diselenide ($WSe_2$) 214. In the illustrated implementation, each of the twisted bilayer graphene 212 and the layer of tungsten diselenide 214 is layered on and supported by a dielectric substrate 216, such as hexagonal boron nitride (HBN), that has been exfoliated to be atomically flat, such that the magic-angle twisted bilayer graphene and the layer of tungsten diselenide are substantially encapsulated by the dielectric substrate. At the interface between the twisted trilayer graphene 212 and the layer of tungsten diselenide 214, a stable time-reversal symmetry breaking field associated with the interface is obtained, and a ferromagnetic resonance associated with the interface can be controlled via a set of gate electrodes 220 and 222, or more precisely, a voltage applied to the gate electrodes, to provide and dynamically control a superconducting diode provided by the structure. Depending on the arrangement, the field effect doping can be applied as to provide a moiré filling fraction between 2 and 3 or between −2 and −3, in which the ferromagnetic resonance is realized.

During fabrication, each layer 212, 214, and 216 of the structure 210 is exfoliated onto a silicon chip, which is then picked up sequentially with a poly(bisphenol A carbonate) (PC)/polydimethylsiloxane (PDMS) stamp. A monolayer graphene is cut in two halves using an atomic force microscope (AFM) tip. The two pieces are picked up with an intended rotational misalignment of 1.2, slightly larger than the final twist angle of the structure 210. The substrate 216 and the magic-angle twisted bilayer graphene 212 are misaligned with an angle of fifteen degrees, whereas the magic-angle twisted bilayer graphene 212 and the tungsten diselenide 214 are rotationally misaligned by forty-four degrees, which is equivalent to a twist angle of sixteen degrees. This twist angle of sixteen degrees is expected to give rise to a maximum spin orbital coupling strength for the structure 216.

In one example, the illustrated layers of the structure 210 include a first gate electrode 220 composed of graphite, with a thickness of seven nanometers, a first layer of the hexagonal boron nitrate substrate 216 with a thickness of sixty-one nanometers, a layer of tungsten diselenide 214, with a thickness of two nanometers, the magic-angle twisted bilayer graphene 212, a second layer of the hexagonal boron nitrate substrate 216 with a thickness of thirty-seven nanometers, and a second gate electrode 222 composed of graphite, with a thickness of five nanometers. The structure 210 can be fabricated with standard electron-beam lithography, reactive-ion etching (RIE), and electron-beam evaporation procedures. The atomic interface between the magic-angle twisted bilayer graphene 212 and the tungsten diselenide 214 induces strong coupling between the spin and orbital degrees of freedom in the magic-angle twisted bilayer graphene 212, which can convert a resonance response in the spin channel into changes in a resistivity of the structure 210.

A transmission line 230 is positioned proximately to the structure 210 and a microwave signal source 232 is operative connected to the transmission line to provide a microwave signal across the transmission line. The microwave signal generates an in-plane magnetic field and an out-of-plane electric field at the structure 210. In response to these fields, the structure 210 will exhibit a transport response that is a function of a moiré filling fraction of the structure, a frequency of the microwave signal, and a power of the microwave signal. Each of these parameters can be tuned such that the transport response is effectively a rectified version of the microwave signal, having a frequency of less than twenty hertz. Alternatively, these parameters can be tuned to allow the structure to function as a parametric amplifier. Additional details helpful in understanding the structure 210 and the system 200 can be found in a first paper, *Spin-orbit-driven ferromagnetism at half moiré filling in magic-angle twisted bilayer graphene*, by Lin et al. in Science (Vol 375, Issue 6579 pgs. 437-441), and a second paper, *Electron spin resonance and collective excitations in magic-angle twisted bilayer graphene* by Morissette et al. (available at https://arxiv.org/abs/2206.08354v2). Each of these papers is hereby incorporated by reference.

Signal rectification and parametric amplification are key functions for realizing computational circuits, and a platform capable of performing these functions in the quantum limit with high energy efficiency is of central importance to advance our technological capability towards quantum computation. The illustrated system 200 provides signal rectification and parametric oscillation in two-dimensional materials. Given the efficiency in the signal rectification, the structure 210 could play a key role in information processing in a quantum circuit. The structure can be as thin as 10-20 layers of atoms, which supports a highly compact design. At the same time, the extreme thinness allows the structure to be integrated into a bigger circuits and function as a signal rectifier and signal sensor. The rectification can also be modulated using field effect doping at the gate electrodes 220 and 222, offering more advanced ability for programing the circuit. Signal rectification and parametric oscillation in the illustrates system 200 has been observed with a DC current as small as one nanoamp, making such electric component highly energy efficient.

Figure 3:
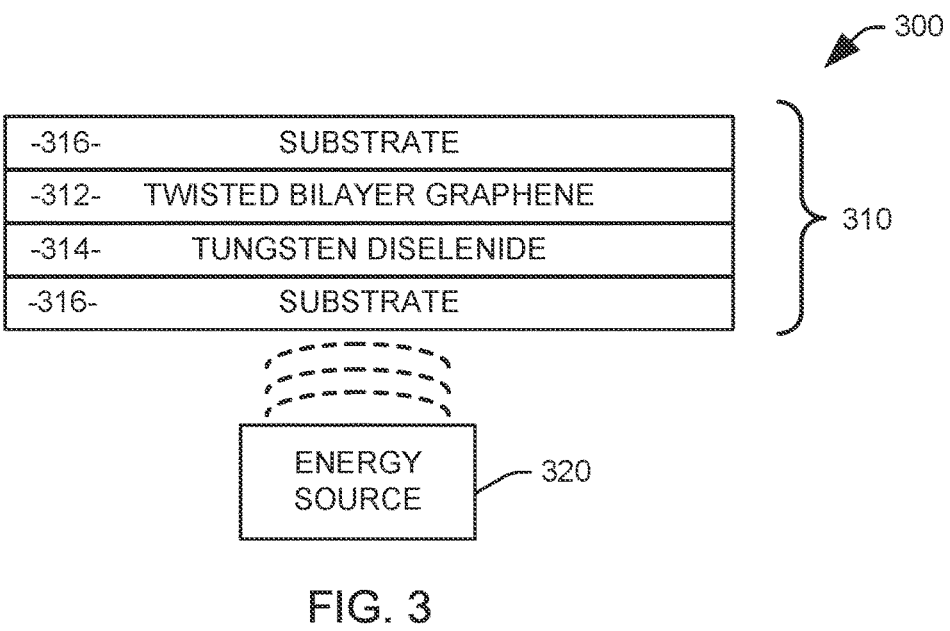
FIG. 3 illustrates another example implementation of the system of FIG. 1 utilizing a structure formed from twisted bilayer graphene and a layer of tungsten diselenide.

FIG. 3 illustrates another example implementation 300 of the system of FIG. 1 utilizing a structure 310 formed from twisted bilayer graphene 312 and a layer of tungsten diselenide ($WSe_2$) 314. In the illustrated implementation, each of the twisted bilayer graphene 312 and the layer of tungsten diselenide 314 is layered on and supported by a dielectric substrate 316, such as hexagonal boron nitride (HBN), that has been exfoliated to be atomically flat, such that the twisted bilayer graphene and the layer of tungsten diselenide are substantially encapsulated by the dielectric substrate. At the interface between the twisted bilayer graphene 312 and the layer of tungsten diselenide 314, a stable time-reversal symmetry breaking field associated with the interface is obtained, and a valley ferromagnetic state associated with the interface can be controlled via applied energy from an energy source 320 to function as a memory. In one example, an electric field is generated by applying respective voltage biases to gate electrodes on opposing sides of the structure 310. In another implementation, the valley ferromagnetic state can be controlled via an applied electric or magnetic field. Through application of the energy from the energy source 320, the ferromagnetic state can be changed to store a bit or to read out a bit previously stored.

In one implementation, read and write operations on the structure 310 can be performed using a direct current (DC). For instance, a DC current as small as one hundred nano-amps can switch the magnetic state associated with the interface to store a bit, and a DC current as small as one nanoamp can read out the magnetic state, and the corresponding stored bit, from the structure 310, which is a much smaller current compared what is needed in conventional memory devices. Accordingly, in one implementation, a direct current between one hundred and five hundred nano-amps can be used for storing, or writing bits, to the structure, and a direct current between one and five nanoamps can be used for reading bits from the structure. The compactness of conventional memory is limited by the magnetic field control. This challenge is addressed by the electric field and current control in the illustrates system.

The magnetic state can be controlled using a local capacitor or current flow, which allows for a more compact design in the magnetic memory as well as multiple modes of operation for the magnetic memory and extremely high energy efficiency in operating the memory. The illustrated two-dimensional material magnetic memory is as thin as ten to twenty layers of atoms, which supports a highly compact design. The magnetic state can be controlled using electric field and DC current flow, which allows accurate local controls that can be realized through standard lithographic procedures. In addition, a global control for all memory unit can be realized using external magnetic field. This multimode control is advantageous for memory unit with complex multi-layer constructions. In addition, the electric field and current control on the memory state is key for realizing energy efficient memory operation.

Figure 4:
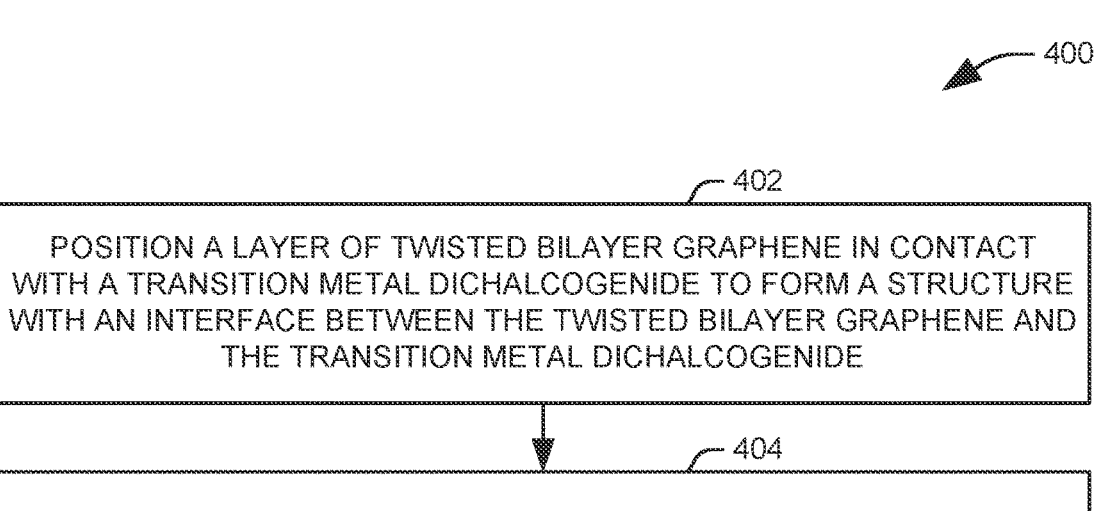
FIG. 4 illustrates an example of a method for fabricating an assembly having a magnetic state and ferromagnetic resonance that is controllable to provide a desired function

In view of the foregoing structural and functional features described above in FIGS. 1-3, an example method will be better appreciated with reference to FIG. 4. While, for purposes of simplicity of explanation, the method of FIG. 4 is shown and described as executing serially, it is to be understood and appreciated that the present invention is not limited by the illustrated order, as some actions could in other examples occur in different orders and/or concurrently from that shown and described herein.

FIG. 4 illustrates an example of a method 400 for fabricating an assembly having a magnetic state and ferromagnetic resonance that is controllable to provide a desired function. At 402, a layer of twisted bilayer graphene is positioned in contact with a transition metal dichalcogenide to form a structure with an interface between the twisted bilayer graphene and the transition metal dichalcogenide. In one example, the twisted bilayer graphene has a twist angle between one degree and one and one-tenth degrees, and the layer of twisted bilayer graphene and the transition metal dichalcogenide are positioned as to have a twist angle between the layers that is between ten degrees and twenty degrees. In one implementation, the structure is formed by exfoliating a first surface of each of first and second substrates formed from a dielectric material to provide atomically flat surfaces. The layer of twisted bilayer graphene is applied to the first surface of the first substrate, and the transition metal dichalcogenide to the first surface of the second substrate. Graphite gate electrodes are applied to respective second surfaces of each of the first substrate the second substrate.

At 404, energy is applied to the interface to adjust one of a magnetic state associated with the interface and a ferromagnetic resonance associated with the interface. Applying energy to the interface can include, for example, one or more of applying a DC current to the interface, applying an out-of-plane electric field to the interface, applying a magnetic field to the interface, or applying a voltage bias to a gate electrode associated with the interface to control the magnetic state associated with the interface. In one example, in which the structure operates as a magnetic memory, energy can be applied to the interface to change the magnetic state associated with the interface from a first state to a second state as to store a bit within the structure. For example, a direct current of between one hundred nanoamps and five hundred nanoamps to the interface to change the magnetic state. Once a bit has been stored, energy can be applied to the interface to read out the magnetic state associated with the interface. In one example, a direct current of between one nanoamp and five nanoamps can be applied to the interface to readout the magnetic state.

In another example, applying energy to the interface comprises applying a bias voltage to a gate electrode associated with the interface to adjust a frequency associated with the ferromagnetic resonance. Additionally or alternative, a microwave signal can be passed through a transmission line positioned proximally to the structure as to provide each of a magnetic field and an electric field to the structure. Either or both of a frequency and a power of the microwave signal can be selected to provide a transport response at the structure having a frequency less than twenty hertz. In one example, a gate voltage can be applied to tune a moiré filling fraction at the interface, and the frequency and power can be tuned to provide the desired transport response.

What have been described above are examples of the present invention. It is, of course, not possible to describe every conceivable combination of components or methodologies for purposes of describing the present invention, but one of ordinary skill in the art will recognize that many further combinations and permutations of the present invention are possible. While certain novel features of this invention shown and described below are pointed out in the annexed claims, the invention is not intended to be limited to the details specified, since a person of ordinary skill in the relevant art will understand that various omissions, modifications, substitutions and changes in the forms and details of the invention illustrated and in its operation may be made without departing in any way from the spirit of the present invention. Accordingly, the present invention is intended to embrace all such alterations, modifications, and variations that fall within the scope of the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements. No feature of the invention is critical or essential unless it is expressly stated as being "critical" or "essential."

What is claimed is:

1. A method for fabricating an assembly, the method comprising:

positioning a layer of twisted bilayer graphene in contact with a transition metal dichalcogenide to form a structure with an interface between the twisted bilayer graphene and the transition metal dichalcogenide; and applying energy to the interface to adjust one of a magnetic state associated with the interface and a ferromagnetic resonance associated with the interface.

2. The method of claim 1, wherein applying energy to the interface comprises one of applying a DC current to the interface, applying an out-of-plane electric field to the interface, applying a magnetic field to the interface, and applying a voltage bias to a gate electrode associated with the interface to control the magnetic state associated with the interface.

3. The method of claim 1, wherein applying energy to the interface comprises applying energy to the interface to change the magnetic state associated with the interface from a first state to a second state as to store a bit within the structure.

4. The method of claim 3, wherein applying energy to the interface comprises applying a direct current of between one hundred nanoamps and five hundred nanoamps to the interface.

5. The method of claim 3, wherein further comprising applying energy to the interface to read out the magnetic state associated with the interface.

6. The method of claim 5, wherein applying energy to the interface to read out the magnetic state associated with the interface comprises applying a direct current of between one nanoamp and five nanoamps to the interface.

7. The method of claim 1, wherein applying energy to the interface comprises applying a bias voltage to a gate electrode associated with the interface to adjust a frequency associated with the ferromagnetic resonance.

8. The method of claim 1, wherein applying energy to the interface comprises passing a microwave signal through a transmission line positioned proximally to the structure as to provide each of a magnetic field and an electric field to the structure.

9. The method of claim 8, wherein one of a frequency and a power of the microwave signal is selected to provide a transport response at the structure having a frequency less than twenty hertz.

10. The method of claim 1, further comprising:

exfoliating a surface of a first substrate formed from a dielectric material to provide an atomically flat surface;

applying the layer of twisted bilayer graphene to the surface of the first substrate;

exfoliating a surface of a second substrate formed from the dielectric material to provide an atomically flat surface; and applying the transition metal dichalcogenide to the surface of the second substrate.

11. The method of claim 10, wherein the surface of the first substrate is a first surface of the first substrate, the surface of the second substrate is a first surface of the second substrate, and the method further comprising applying a graphite gate electrode to each of a second surface of the first substrate and a second surface of the second substrate.

12. The method of claim 1, wherein the layer of twisted bilayer graphene and the transition metal dichalcogenide are positioned as to have a twist angle between the layers that is between ten degrees and twenty degrees.

13. A system comprising:

a transmission line configured to carry a microwave signal; and a structure comprising a layer of a magic-angle twisted bilayer graphene positioned in contact with a transition metal dichalcogenide to form an interface between the magic-angle twisted bilayer graphene and the transition metal dichalcogenide and positioned proximally to the transmission line such that transmission of the microwave signal through the transmission line generates a transport response at the structure.

14. The system of claim 13, wherein the layer of magic-angle twisted bilayer graphene and the transition metal dichalcogenide are positioned as to have a twist angle between the layers that is between ten degrees and twenty degrees.

15. The system of claim 13, wherein the structure further comprises a set of gate electrodes positioned to provide field effect doping at the interface, and the system further comprising a voltage source configured to provide a voltage bias to the set of gate electrodes.

16. The system of claim 13, further comprising a microwave signal source that provides the microwave signal, the microwave signal source providing the microwave signal with one of a frequency and a power of the microwave signal selected to provide a transport response at the structure having a frequency less than twenty hertz.

17. A system comprising:

a structure comprising a layer of a twisted bilayer graphene positioned in contact with a transition metal dichalcogenide to form an interface between the twisted bilayer graphene and the transition metal dichalcogenide; and a control apparatus associated with the structure configured to apply energy to the structure to control a magnetic state associated with the interface.

18. The system of claim 17, wherein the control apparatus applies one of a DC current, an out-of-plane electric field, a magnetic field, and a voltage bias to the structure to change the magnetic state associated with the interface from a first state to a second state as to store a bit within the structure.

19. The system of claim 18, wherein the control apparatus provides a direct current of between one hundred and five hundred nanoamps to change the magnetic state associated with the interface.

20. The system of claim 18, wherein the control apparatus further applies energy to the interface to read the bit stored in the structure.

* * * * *